US009685558B2

(12) United States Patent
Cho et al.

(10) Patent No.: US 9,685,558 B2
(45) Date of Patent: Jun. 20, 2017

(54) FLEXIBLE ELECTRONIC DEVICE HAVING ADHESIVE FUNCTION AND METHOD OF MANUFACTURING THE SAME

(71) Applicant: CENTER FOR ADVANCED SOFT ELECTRONICS, Pohang-si, Gyeongsangbuk-do (KR)

(72) Inventors: Kilwon Cho, Pohang-si (KR); Yoonyoung Chung, Seoul (KR); Hyun Ho Kim, Seoul (KR)

(73) Assignee: CENTER FOR ADVANCED SOFT ELECTRONICS, Pohang (KR)

( * ) Notice: Subject to any disclaimer, the term of this patent is extended or adjusted under 35 U.S.C. 154(b) by 0 days.

(21) Appl. No.: 14/757,537

(22) Filed: Dec. 23, 2015

(65) Prior Publication Data
US 2017/0025547 A1    Jan. 26, 2017

(30) Foreign Application Priority Data
Jul. 20, 2015  (KR) .................. 10-2015-0102689

(51) Int. Cl.
*H01L 21/00* (2006.01)
*H01L 29/00* (2006.01)
(Continued)

(52) U.S. Cl.
CPC .... *H01L 29/78684* (2013.01); *H01L 21/0223* (2013.01); *H01L 21/02527* (2013.01);
(Continued)

(58) Field of Classification Search
CPC ........... H01L 21/0223; H01L 21/02527; H01L 21/02252; H01L 29/78684; H01L 29/78603; H01L 29/66045; H01L 29/42364; H01L 29/1606; H01L 29/42356; H01L 51/0097; H01L 51/0516; H01L 51/0545; H01L 51/0041; H01L 51/0558; H01L 51/5246; H01L 51/52
See application file for complete search history.

(56) References Cited

U.S. PATENT DOCUMENTS 7,442,587 B2 * 10/2008 Amundson ............. B60C 23/04
257/59
8,287,325 B2 * 10/2012 Furukawa ........... H01L 27/3274
257/57
(Continued)

FOREIGN PATENT DOCUMENTS

| JP | 2009530470 A | 8/2009 |
|---|---|---|
| KR | 1020010102389 A | 11/2001 |

(Continued)

*Primary Examiner* — Nikolay Yushin
(74) *Attorney, Agent, or Firm* — STIP Law Group, LLC

(57) ABSTRACT

Disclosed is a flexible electronic device having an adhesive function, including an adhesive tape that includes a flexible film and an adhesive layer formed on one side of the flexible film, and an electronic device formed on a remaining side of the flexible film of the adhesive tape. Accordingly, the flexible electronic device of the present invention is transferred on a surface of various flexible materials or materials having a curved surface so as to freely adhere and minimize breakage of the electronic device and maintain performance over a long period of time, even if the substrate is modified or repeatedly bent.

17 Claims, 5 Drawing Sheets

(51) Int. Cl.
   *H01L 51/00*    (2006.01)
   *H01L 29/786*   (2006.01)
   *H01L 51/05*    (2006.01)
   *H01L 29/16*    (2006.01)
   *H01L 29/423*   (2006.01)
   *H01L 29/66*    (2006.01)
   *H01L 21/02*    (2006.01)

(52) U.S. Cl.
   CPC .... *H01L 29/1606* (2013.01); *H01L 29/42356* (2013.01); *H01L 29/42364* (2013.01); *H01L 29/66045* (2013.01); *H01L 29/78603* (2013.01); *H01L 51/0041* (2013.01); *H01L 51/0097* (2013.01); *H01L 51/0516* (2013.01); *H01L 51/0545* (2013.01); *H01L 51/0558* (2013.01); *H01L 21/02252* (2013.01)

(56) References Cited

U.S. PATENT DOCUMENTS

| | | | |
|---|---|---|---|
| 9,293,731 B2 * | 3/2016 | Kim | H01L 51/5256 |
| 2015/0129845 A1 * | 5/2015 | Kim | H01L 51/5256 257/40 |
| 2016/0028012 A1 * | 1/2016 | Cheng | H01L 51/003 438/23 |

FOREIGN PATENT DOCUMENTS

| | | | |
|---|---|---|---|
| KR | 1020120068390 A | 6/2012 | |
| KR | 1020150081563 A | 7/2015 | |

* cited by examiner a b c

… (1)

FLEXIBLE ELECTRONIC DEVICE HAVING ADHESIVE FUNCTION AND METHOD OF MANUFACTURING THE SAME

The present application claims the priority benefit of Korean Patent Application No. 10-2015-0102689 filed Jul. 20, 2015, which is hereby incorporated by reference.

BACKGROUND OF THE INVENTION

1. Field of the Invention

The present invention relates to a flexible electronic device having an adhesive function and a method of manufacturing the same, and to a technology of forming a flexible electronic device on an adhesive tape that includes an adhesive layer so as to manufacture a flexible electronic device having an adhesive function.

2. Description of the Related Art

It is expected that flexible electronic devices will be an important technological component in future industries. For example, a thin film transistor embodied on a plastic substrate may be used to drive a bendable liquid crystal display device, electronic paper, which has attracted great attention recently, or an organic light emitting device. In particular, electronic paper, which has been developed in recent years, is a display device that uses voltage driving to obviate high charge mobility and a high switching speed, and is a technology that is usefully applied to bendable large-area displays, thus having very high applicability to a thin film transistor manufactured on a flexible substrate.

The flexible electronic device in the related art is advantageous in that a thin film-type plastic substrate reduces the weight thereof and entails a relatively low risk of breakage, but the device may still break when bending force is applied thereto, and moreover is not structurally compatible with existing two-dimensional planar devices. Further, a process of detaching a fixed substrate from the plastic substrate is required after an array process of the thin film transistors. Therefore, the number of manufacturing processes is increased, thereby reducing the mass-producibility of products and reducing competitiveness from the aspect of process efficiency.

Further, when an electronic device needs to be attached to a material having a curved surface, such as work clothes or various articles, the substrate supporting the device may be deformed and thus break, and when the target to which the electronic device is attached is made of a flexible or bendable material, the device continuously receives resistance and thus the lifespan thereof is reduced.

Therefore, there is a need to develop a flexible electronic device having an adhesive property so as to minimize the breakage of the device on a substrate, make it easy to detach the device from the fixed substrate after an array process of the electronic device such as thin film transistors on the electronic device, and make it easy to attach to various materials regardless of repeated bending or curving force.

SUMMARY OF THE INVENTION

Accordingly, the present invention has been made keeping in mind the above problems occurring in the related art, and an object of the present invention is to provide a flexible electronic device having an adhesive function so as to be freely adhered to the surface of various flexible materials or materials having a curved surface and to minimize breakage of the electronic device and maintain performance over a long period of time, even if the substrate is modified or repeatedly curved.

In order to accomplish the above object, the present invention provides a flexible electronic device having an adhesive function, the device including an adhesive tape including a flexible film and an adhesive layer formed on one side of the flexible film, and an electronic device formed on a remaining side of the flexible film of the adhesive tape.

The electronic device may include the flexible film as a substrate.

The flexible electronic device may be one or more selected from a field-effect transistor, a solar cell, an organic light emitting diode, a tactile sensor, a radio frequency identification tag, an electronic paper, and a bio sensor.

The flexible electronic device having the adhesive function may be a field-effect transistor, and the field-effect transistor may include an adhesive tape including a flexible film and an adhesive layer formed on one side of the flexible film, a gate electrode positioned on the remaining side of the flexible film of the adhesive tape, a gate insulating layer positioned on the gate electrode, a source electrode and a drain electrode positioned on the gate insulating layer and disposed so as to be spaced apart from each other, and an active layer positioned on the gate insulating layer to electrically connect the source electrode and the drain electrode.

The adhesive tape may further include a surface reforming layer disposed on the remaining side of the flexible film so as to planarize the surface of the remaining side.

The surface reforming layer may include one or more selected from polyimide, polyacrylate, polyurethane, polyethylene, polyvinylphenol, and polyvinyl alcohol.

The adhesive tape may have a Young's modulus that is lower than the Young's modulus of the surface reforming layer.

The surface reforming layer may have a root-mean-square roughness of 0.1 to 1 nm.

The gate insulating layer may have a thickness of 1 to 10 nm.

The active layer may include one or more selected from graphene, PQT-12 (poly(3,3'''-didodecyl quarterthiophene)), P3HT (poly(3-hexyl thiophene)), P3BT (poly(3-butyl thiophene)), P3OT (poly(3-octyl thiophene)), PPy (polypyrrole), PANI (polyaniline), PDPP (polydiketopyrrolopyrrole), PIID (polyisoindigo), PPDI (poly(perylene diimide)), PNDI (poly (naphthalene diimide)), PEO (poly(ethylene oxide)), PCL (poly(ε-caprolactone)), PMMA (poly(methyl methacrylate)), PS (polystyrene), PVP (poly(vinyl pyrrolidone)), pentacene, rubrene, copper phthalocyanine, and fullerene.

In order to accomplish another object, the present invention provides a method of manufacturing a flexible electronic device having an adhesive function, including (a) preparing an adhesive tape including a flexible film and an adhesive layer formed on one side of the flexible film, and (b) forming an electronic device on the remaining side of the flexible film of the adhesive tape.

The method of manufacturing the flexible electronic device may further include applying a surface reforming layer on the remaining side of the flexible film of the adhesive tape after (a) the preparing the adhesive tape.

The electronic device of (b) the forming the electronic device may be one or more selected from a field-effect transistor, a solar cell, an organic light emitting diode, a tactile sensor, a radio frequency identification tag, an electronic paper, and a bio sensor.

The electronic device of (b) the forming the electronic device may be a field-effect transistor, and (b) the forming the electronic device may include (b-1) forming a gate electrode on the remaining side of a flexible film of an adhesive tape, (b-2) forming a gate insulating layer on the gate electrode, (b-3) forming a source electrode and a drain electrode on the gate insulating layer, and (b-4) forming an active layer through which the source electrode and the drain electrode are electrically connected on the gate insulating layer.

(b-2) The forming the gate insulating layer may be performed using any one process selected from UV ozone treatment, heat treatment in an oxygen atmosphere, and oxygen plasma treatment.

(b-2) The forming the gate insulating layer may be performed using the oxygen plasma treatment.

The oxygen plasma treatment may be performed under a condition of RF power of 10 to 300 W.

The oxygen plasma treatment may be performed under a condition of pressure of 1 to 1000 mTorr.

The active layer may be a graphene layer, and the graphene layer may be any one selected from graphene manufactured using physical or chemical stripping, graphene manufactured by growing in SiC, and graphene manufactured using a chemical vapor deposition process.

(b-4) The forming the active layer may be performed using a dry transfer process.

The flexible electronic device of the present invention can be freely adhered to the surface of various flexible materials or materials having a curved surface, and breakage of the electronic device is minimized and performance is maintained over a long period of time even if the substrate is modified or repeatedly bent.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
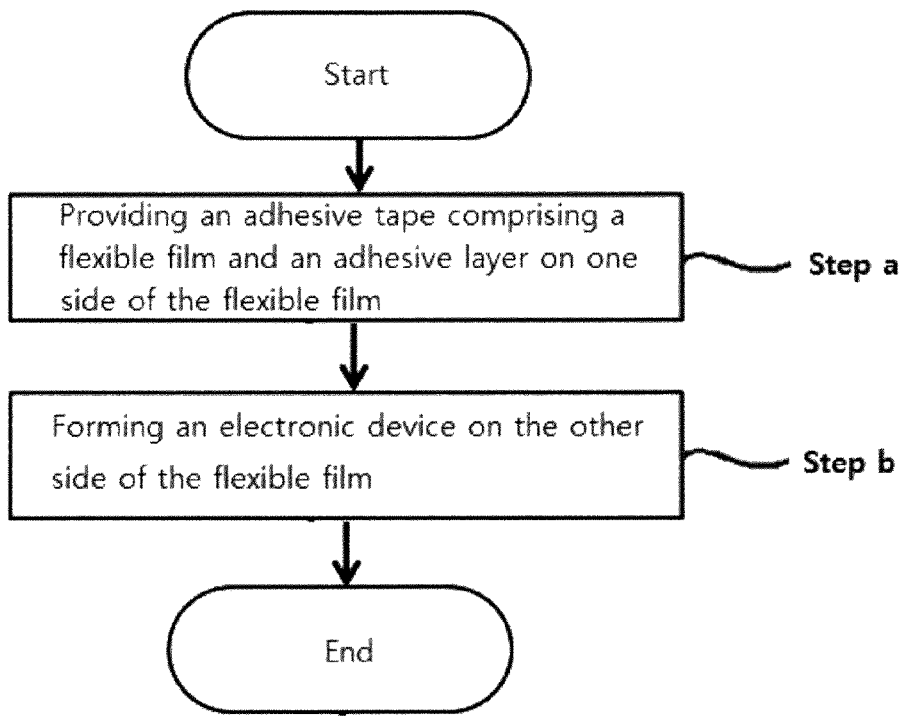
FIG. 1 is a flowchart sequentially showing a method of manufacturing a flexible electronic device having an adhesive function of the present invention.

The present invention will be described more fully hereinafter, in which embodiments and examples of the invention are shown so as to be easily understood by those skilled in the art to which the present invention pertains.

The terminology used herein is for the purpose of describing particular embodiments only and is not intended to be limiting of the invention. The following description does not limit the present invention to the specific embodiments, and should be understood to include all variations, equivalents or substitutions within the spirit and scope of the present invention. Furthermore, descriptions of known techniques, even if they are pertinent to the present invention, are considered unnecessary and may be omitted insofar as they would make the characteristics of the invention unclear.

As used herein, the terms "first," "second," etc. may be used to describe various elements, but these elements should not be limited by these terms. These terms are only used to distinguish one element from another element. For example, the first element may be designated by the second element, and similarly, the second element may be designated by the first element within the scope of the present invention.

Further, it will be understood that when an element is referred to as being "formed" or "layered" on another element, it can be formed or layered so as to be directly attached to the entire surface or one surface of the other element, or intervening elements may be present.

Unless otherwise stated, the singular expression includes a plural expression. In this application, the terms "include" or "have" are used to designate the presence of features, numbers, steps, operations, elements, or combinations thereof described in the specification, and should be understood as not excluding the presence or additional possibility of one or more different features, numbers, steps, operations, elements, or combinations thereof.

Hereinafter, a flexible electronic device having an adhesive function of the present invention will be described.

A flexible electronic device having an adhesive function of the present invention may include an adhesive tape including a flexible film and an adhesive layer formed on one side of the flexible film, and an electronic device formed on the remaining side of the flexible film of the adhesive tape.

The electronic device may include the flexible film as a substrate.

The electronic device may be a field-effect transistor, a solar cell, an organic light emitting diode, a tactile sensor, a radio frequency identification tag, an electronic paper, or a bio sensor.

The flexible electronic device having the adhesive function may be a field-effect transistor that includes an adhesive tape including a flexible film and an adhesive layer formed on one side of the flexible film, a gate electrode positioned on the remaining side of the flexible film of the adhesive tape, a gate insulating layer positioned on the gate electrode, a source electrode and a drain electrode positioned on the gate insulating layer and disposed so as to be spaced apart from each other, and an active layer positioned on the gate insulating layer so as to electrically connect the source electrode and the drain electrode.

A surface reforming layer may be further included on the remaining side of the flexible film of the adhesive tape so as to planarize the surface of the remaining side.

The surface reforming layer may be polyimide, polyacrylate, polyurethane, polyethylene, polyvinylphenol, or polyvinyl alcohol. The surface reforming layer may be preferably polyimide.

The adhesive tape may have a Young's modulus that is lower than that of the surface reforming layer.

The Young's modulus of the adhesive tape may be preferably 0.1 to 100 MPa, and more preferably 1 to 10 MPa.

Further, it is preferable that the Young's modulus of the surface reforming layer be relatively higher than that of the adhesive tape, and the Young's modulus of the surface reforming layer may be 0.1 to 100 GPa, and more preferably 1 to 10 GPa.

The root-mean-square roughness of the surface of the adhesive tape may be preferably 10 to 100 nm, and more preferably 20 to 80 nm.

The thickness of the surface reforming layer may be preferably 1 to 20 µm, and more preferably 5 to 15 µm.

The root-mean-square roughness of the surface reforming layer may be preferably 0.1 to 1 nm, and more preferably 0.1 to 0.4 nm.

The thickness of the gate insulating layer may be preferably 1 to 10 nm, and more preferably 3 to 7 nm.

Au, Al, Ag, Be, Bi, Co, Cu, Cr, Hf, In, Mn, Mo, Mg, Ni, Nb, Pb, Pd, Pt, Rh, Re, Ru, Sb, Ta, Te, Ti, V, W, Zr, and Zn may be applied to the source electrode and the drain electrode.

The organic active layer may be graphene, PQT-12 (poly (3,3'''-didodecyl quarterthiophene)), P3HT (poly(3-hexyl thiophene)), P3BT (poly(3-butyl thiophene)), P3OT (poly (3-octyl thiophene)), PPy (polypyrrole), PANI (polyaniline), PDPP (polydiketopyrrolopyrrole), PIID (polyisoindigo), PPDI (poly(perylene diimide)), PNDI (poly(naphthalene diimide)), PEO (poly(ethylene oxide)), PCL (poly(ε-caprolactone)), PMMA (poly(methyl methacrylate)), PS (polystyrene), PVP (poly(vinyl pyrrolidone)), pentacene, rubrene, copper phthalocyanine, and fullerene.

The flexible electronic device of the present invention may be attached to the surface of various flexible materials or materials having a curved surface. For example, the flexible material may be pens, skin, paper money, clothing, or glass.

FIG. 1 is a flowchart sequentially showing a method of manufacturing the flexible electronic device having the adhesive function of the present invention. Hereinafter, the method of manufacturing the flexible electronic device having the adhesive function of the present invention will be described with reference to FIG. 1.

First, the adhesive tape including the flexible film and the adhesive layer formed on one side of the flexible film is prepared (step a).

The method may further include applying a surface reforming layer on the remaining side of the flexible film of the adhesive tape.

The applying may be physical vapor deposition, chemical vapor deposition, spin coating, inkjet printing, dip coating, drop casting, bar coating, or slot die coating. Preferably, the applying may be spin coating.

After the applying, the coated adhesive tape may be heated so as to dry it.

The electronic device is then formed on the remaining side of the flexible film of the adhesive tape (step b).

For the electronic device, various electronic devices such as a field-effect transistor, a solar cell, an organic light emitting diode, a tactile sensor, a radio frequency identification tag, an electronic paper, and a bio sensor may be applied, but the process of forming the field-effect transistor will be described hereinafter by way of example.

Specifically, the gate electrode is formed on the remaining side of the flexible film of the adhesive tape (step b-1).

Step b-1 may be performed using a shadow mask, photolithography, a physical vapor deposition process, a chemical vapor deposition process, or spin coating.

Next, the gate insulating layer is formed on the gate electrode (step b-2).

Step b-2 may be preferably performed using UV ozone treatment, heat treatment in an oxygen atmosphere, and oxygen plasma treatment, and more preferably oxygen plasma treatment.

The adhesive tape applied to the present invention is very vulnerable to heat or chemical materials compared to existing polymer substrates, thus being susceptible to damage during processes requiring high temperatures or pressure. Therefore, the gate insulating layer needs to be formed during a mild process at a low temperature without exposure to chemical materials.

Oxygen plasma treatment may be performed under a condition of radio frequency power of preferably 10 to 300 W, and more preferably 200 to 280 W.

Further, the oxygen plasma treatment time may be preferably 1 to 20 min, and more preferably 5 to 15 min under the aforementioned power condition.

Further, the pressure condition of the oxygen plasma may be preferably 1 to 1000 mTorr, and more preferably 10 to 100 mTorr.

Next, the source electrode and the drain electrode are formed on the gate insulating layer (step b-3).

Since the material of the source electrode and the drain electrode is the same as that of the flexible electronic device having the adhesive function, reference may be made to the material of the flexible electronic device for details.

Finally, the active layer, through which the source electrode and the drain electrode are electrically connected, is formed on the gate insulating layer (step b-4).

Since the type of the active layer is the same as that of the flexible electronic device having the adhesive function, reference may be made to the type of the flexible electronic device for details.

Various semiconductor materials may be applied to the active layer, but preferably a graphene layer that includes graphene may be applied.

The graphene layer may be graphene manufactured using physical or chemical stripping, graphene manufactured by growing in SiC, or graphene manufactured using a chemical vapor deposition process.

It is preferable that graphene be subjected to a dry transfer process on the gate insulating layer to form the graphene layer. The reason is that the adhesive tape used in the present invention is susceptible to moisture, and thus it is more preferable to use a dry transfer process than a wet transfer process, as is used in the related art.

Hereinafter, preferable examples of the present invention will be described.

EXAMPLE

Example 1

Scotch tape was prepared as the adhesive tape including polytetrafluoroethylene (PTFE) as the flexible film and the silicon-based adhesive as the adhesive layer (3M™, 5480, PTFE thickness of 50 μm, and silicon-based adhesive thickness of 44 μm). The Scotch tape was attached to the silicon wafer.

Next, the polyimide solution (VTEC™, PI-1388) was applied on the tape attached to the silicon wafer using spin coating at 3000 rpm for 30 sec, and sequentially baked at 60° C. and 150° C. for 10 min to form the polyimide surface reforming layer.

Next, the aluminum layer (30 nm), as the gate electrode, was deposited on the surface reforming layer using heat in the thermal deposition apparatus using the shadow mask.

The aluminum layer was then oxidized in the oxygen plasma chamber under the condition of RF power (radio frequency power) of 250 W for 7 min to form the gate insulating layer on the surface of the aluminum layer. Oxygen pressure was maintained as low as possible while the plasma was present during plasma treatment. The lowest pressure in the plasma chamber was 12 mTorr.

Next, the source and drain electrodes (gold at a thickness of 40 nm on titanium at a thickness of 5 nm) were deposited using heat on the gate insulating layer using the shadow mask.

Finally, the graphene active layer was formed on the gate dielectric layer using the dry transfer process to electrically connect the source and drain electrodes. Specifically, polybutadiene and PMMA were sequentially applied on graphene grown on the copper foil to form the bilayer support layer, graphene present on the opposite surface of the coated surface was removed using the oxygen plasma, and the copper foil was then added to 0.1M ammonium persulfate aqueous solution to be etched. After the copper foil was completely etched, the PMMA/polybutadiene/graphene layer floating in the ammonium persulfate aqueous solution was moved to the distilled water bath, and the PMMA/polybutadiene/graphene layer, floating in water, was then fixed to a sample holder having a hole therein and dried. Next, the polybutadiene/PMMA/graphene layer fixed to the holder was brought into contact with the source and drain electrodes and the gate insulating layer, and heat and pressure were applied to dry-transfer graphene to form the graphene active layer, thus manufacturing the graphene field-effect transistor.

Figure 2:
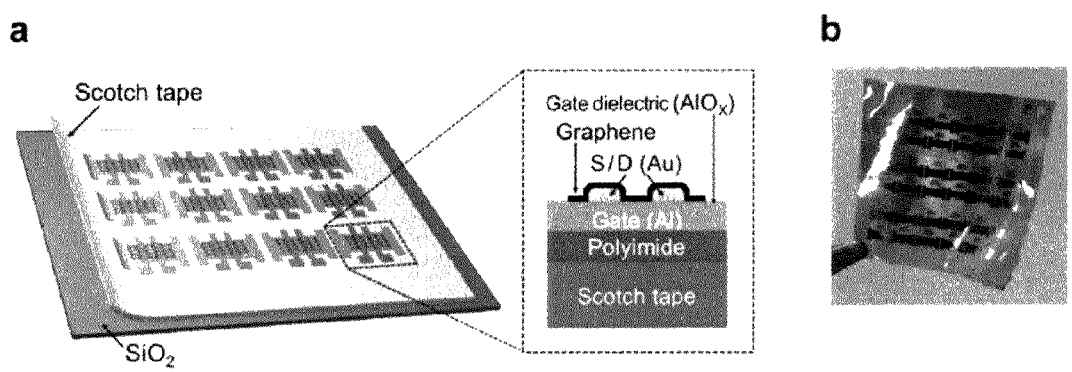
FIG. 2A shows a schematic view and a cross-sectional view of the flexible electronic device having the adhesive function manufactured on a silicon wafer in Example 1.
FIG. 2B is a picture of the flexible electronic device having the adhesive function separated from the silicon wafer.

FIG. 2A shows a schematic view and a cross-sectional view of the flexible graphene field-effect transistor having the adhesive function manufactured on the silicon wafer in Example 1, and FIG. 2B is a picture of the flexible electronic device having the adhesive function separated from the silicon wafer.

Example 2

The graphene field-effect transistor was manufactured using the same method and condition as Example 1, except that the pressure of the oxygen plasma chamber was 50 mTorr rather than 12 mTorr when the gate insulating layer was formed.

Example 3

The graphene field-effect transistor was manufactured using the same method and condition as Example 1, except that the pressure of the oxygen plasma chamber was 100 mTorr rather than 12 mTorr when the gate insulating layer was formed.

Comparative Example 1

The graphene field-effect transistor was manufactured using the same method as Example 1, except that polyimide film (having a thickness of 125 μm) was used as the flexible substrate instead of the Scotch tape including polytetrafluoroethylene (PTFE) and the silicon-based adhesive.

TEST EXAMPLE

Test Example 1

Figure 3:
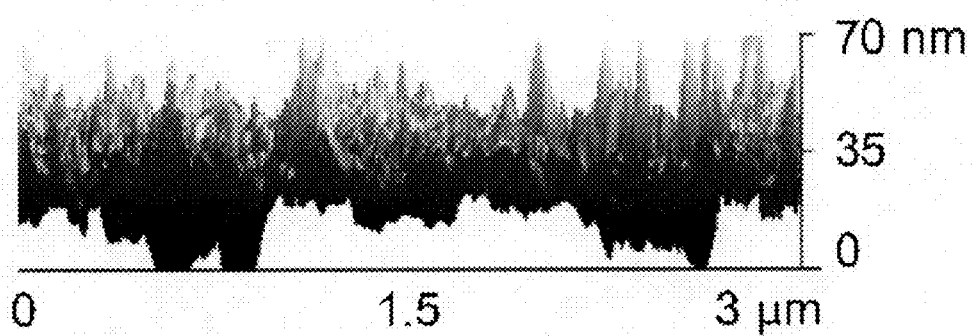
FIG. 3 is an AFM (atomic force microscope) image comparing the roughness before and after the surface of a Scotch tape is coated with polyimide.
Figure 3:
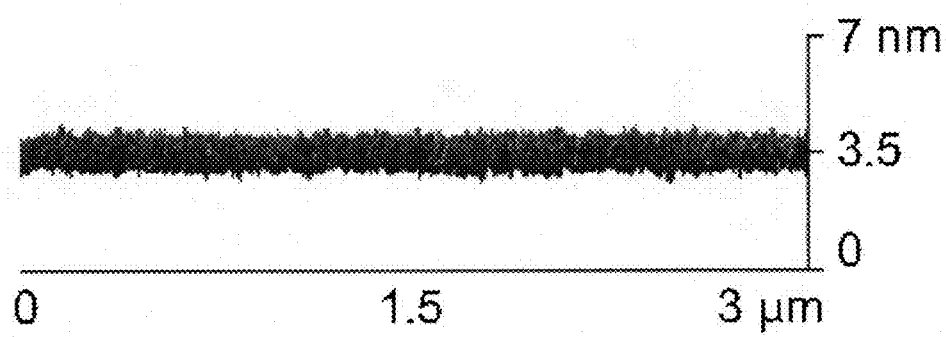

Roughness Comparison of the Substrate Surface Before and after Polyimide Coating FIG. 3 shows the result of a roughness comparison, analyzed using an AFM (atomic force microscope), before and after the PTFE surface of the Scotch tape is coated with polyimide. For the Scotch tape, the Scotch tape of Example 1 was used.

From the analysis result, the roughness of the surface of the Scotch tape and the surface of the Scotch tape coated with polyimide could be confirmed.

Referring to FIG. 3, the root-mean-square roughness of the surface of the Scotch tape was 28.1 nm, indicating a rough surface. However, when the polyimide solution was subjected to spin coating on the surface of the Scotch tape to form a polyimide film having a thickness of 9 μm, the root-mean-square roughness was 0.225 nm, confirming that the surface was planarized at a level similar to that of the silicon wafer. Accordingly, it is judged that the electronic device is more easily attached to the planarized substrate.

Test Example 2

Analysis of Electric Performance of the Graphene Field-Effect Transistor Having the Adhesive Function FIGS. 4A to 4C show images of paper money (A), the silicon wafer (B), and the paper (C) to which the graphene field-effect transistor manufactured in Example 1 was attached, and electric performance analysis results of paper money, the silicon wafer, and the paper.

Figure 4:
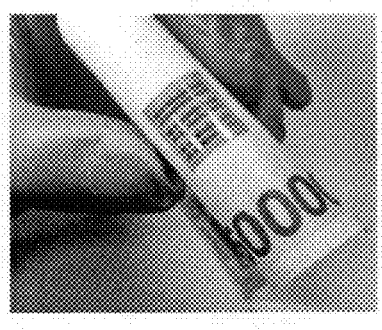
FIGS. 4A to 4C show images of paper money, a silicon wafer, and a paper to which the graphene field-effect transistor manufactured in Example 1 is attached, and the electric performance analysis graphs of the paper money, the silicon wafer, and the paper.
Figure 4:
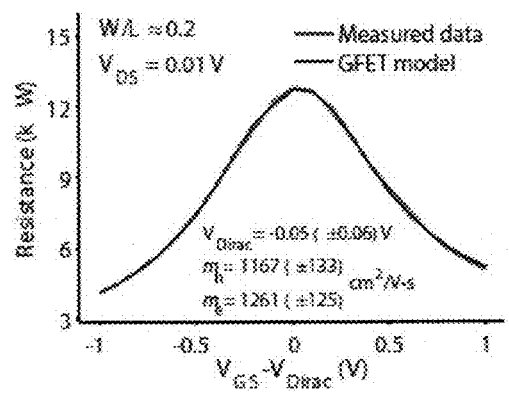
Figure 4:
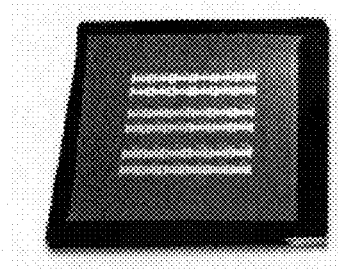
Figure 4:
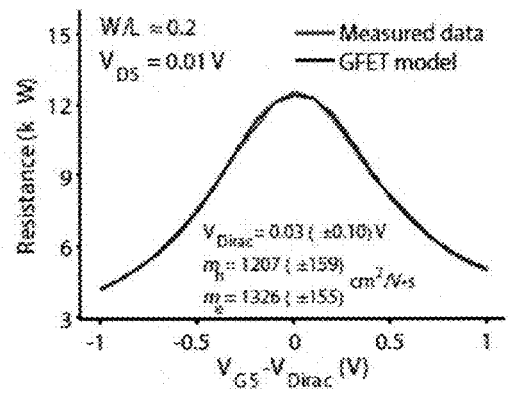
Figure 4:
Figure 4:
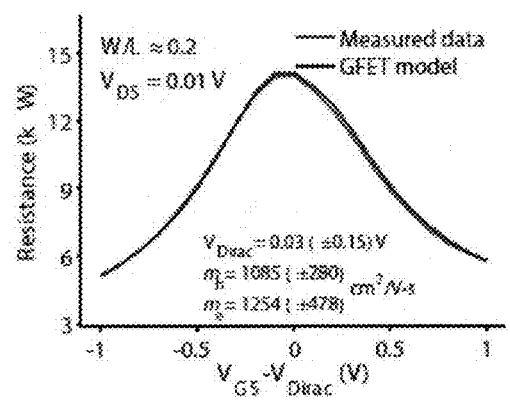

Referring to FIG. 4, the graphene field-effect transistor manufactured in Example 1 was capable of being detached from the silicon wafer and then attached to various required substrates. Further, for electric performance analysis, the electric performance of the graphene field-effect transistor manufactured in Example 1 was first measured, the electric performance was measured after the graphene field-effect transistor was detached from the silicon wafer and then moved to paper money, and the electric performance was measured after the graphene field-effect transistor was detached from paper money, attached to the paper, crumpled, and flattened.

The graphene field-effect transistor manufactured in Example 1 had the channel width fixed to 85 μm and the width-to-length ratio (W/L) fixed to 0.2.

It could be confirmed that the electric performance of the graphene field-effect transistor manufactured in Example 1 was seldom changed even after the graphene field-effect transistor was moved to paper money, and that the electric performance was almost completely maintained even after the graphene field-effect transistor was transferred to the paper and crumpled.

Test Example 3

Figure 5:
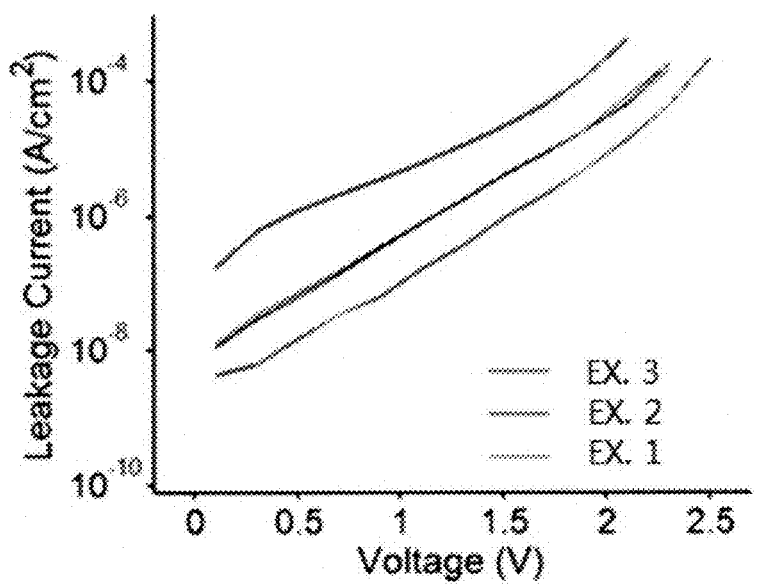
FIG. 5 is a graph showing the measured leakage current densities of the gate insulating layers manufactured in Examples 1 to 3.

Analysis of the Leakage Current of the Flexible Electronic Device Having the Adhesive Function FIG. 5 is a graph showing the measured current densities of the graphene field-effect transistors manufactured in Examples 1 to 3.

Referring to FIG. 5, for the graphene field-effect transistors manufactured in Examples 1 to 3, when the gate insulating layer was formed, the leakage current (current density) passing through the $AlO_X$ layer was reduced and the breakdown voltage was increased as oxygen pressure was reduced during the oxygen plasma treatment process. That is, it could be seen that when the gate insulating layer was formed, higher-quality oxide film was manufactured and the insulating property of the gate insulating layer of the graphene field-effect transistor was improved as the oxygen plasma treatment pressure was reduced.

Further, the capacitance of the existing gate insulator (having a total thickness of 6.4 nm) using atomic layer deposition (ALD) of $AlO_X$ together with the self-assembled monolayer (SAM) was about 0.5 $\mu Fcm^{-2}$, and the leakage current was measured to be $10^{-7}$ $Acm^{-2}$ at 3 V. The capacitance of 0.5 $\mu Fcm^{-2}$ at 3 V induces an electric charge having the same quantity as that of the $AlO_X$ capacitance of 1.5 $\mu Fcm^{-2}$ at 1 V in the case of the aluminum oxide capacitor of Example 1, and the gate leakage current is $10^{-8}$ $Acm^{-2}$ through $AlO_X$ at 1 V and lower than that of preceding research.

Therefore, since the gate insulator of Example 1 has high capacitance, the field-effect transistor (FET) may be satisfactorily operated even at a low voltage of 1 to 1.5 V, which means that it is suitable for adhering the field-effect transistor to various materials and apparatuses to thus be portably used.

Test Example 4

Figure 6:
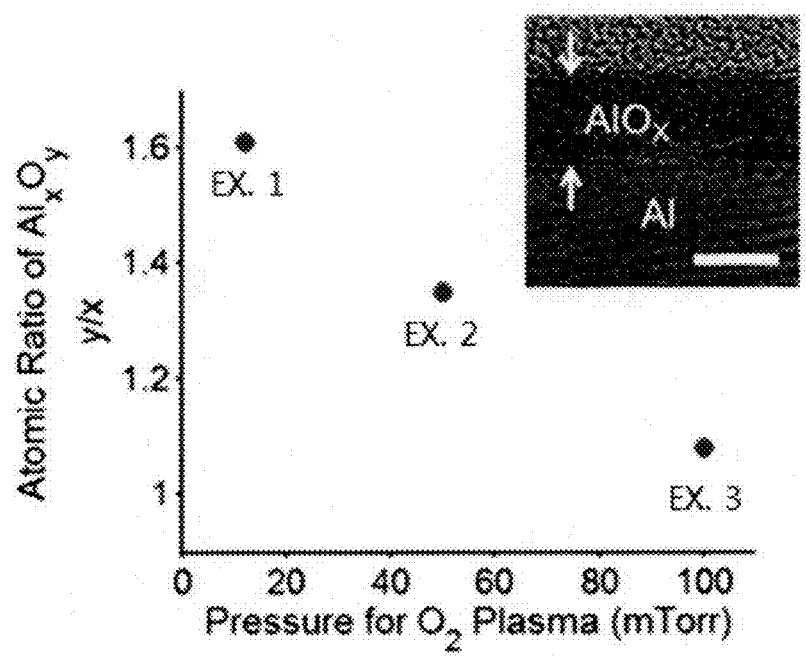
FIG. 6 shows a graph illustrating the measured atomic ratio of $AlO_X$ of graphene field-effect transistors manufactured in Examples 1 to 3 as a function of pressure for oxygen plasma, and also shows a TEM (transmission electron microscope) image of the graphene field-effect transistors.

Analysis of the Leakage Current of the Flexible Electronic Device Having the Adhesive Function FIG. 6 shows a graph illustrating the measured atomic ratio of $AlO_X$ of the graphene field-effect transistors manufactured in Examples 1 to 3 to pressure for oxygen plasma when the gate insulator is formed, and the TEM (transmission electron microscope) image of the cross-sections of the gate and the gate insulator.

The atomic ratio of $AlO_X$ to pressure for oxygen plasma was measured using X-ray photoelectron spectroscopy (XPS) when the graphene field-effect transistor was manufactured in Examples 1 to 3. For XPS measurement, the inelastic mean free path (IMFP) of $AlO_X$ is 5 nm or less when the maximum electron kinetic energy is 1420 eV. Therefore, the angle between the photoelectron detector and the sample stage was 80°, and the measured photoelectrons were obliquely emitted from $AlO_X$.

From FIG. 6, it could be confirmed that the ratio of oxygen was relatively high in the atomic ratio of $AlO_X$ in Example 1, which used the oxygen plasma at low oxygen pressure. Therefore, it could be seen that the insulating property of $AlO_X$ was improved as the ratio of oxygen was increased.

Further, the thickness of $AlO_X$ of the graphene field-effect transistor manufactured in Example 1 was 5.7 nm when measured using a transmission electron microscope (TEM). Assuming that the dielectric constant of the $AlO_X$ layer was 9.5, it could be confirmed that the thickness measured using the TEM conformed to the capacitance value of FIG. 5.

Test Example 5

Measurement of Surface Strain According to Bending Radius

Figure 7:
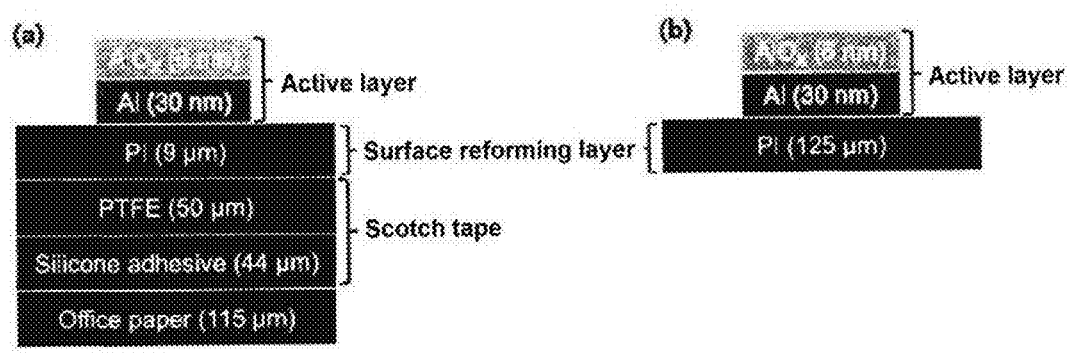
FIG. 7A shows a cross-section of gate insulating layer/gate pattern/polyimide/adhesive tape/office paper including the gate insulating layer/gate pattern/polyimide/adhesive tape manufactured in Example 1 and attached to the office paper.
FIG. 7B shows a cross-section of gate insulating layer/gate pattern/polyimide manufactured in Comparative Example 1.

FIG. 7A shows the cross-section of the office paper to which the field-effect transistor manufactured in Example 1 is attached, and FIG. 7B shows the cross-section of the field-effect transistor manufactured in Comparative Example 1. Among the constitutional elements of the field-effect transistor, only the substrate, the gate electrode, and the gate insulating layer are shown herein, and the remaining structures are omitted. Further, FIG. 8 shows the measured surface strain of the field-effect transistors manufactured in Example 1 and Comparative Example 1 as a function of the bending radius.

Figure 8:
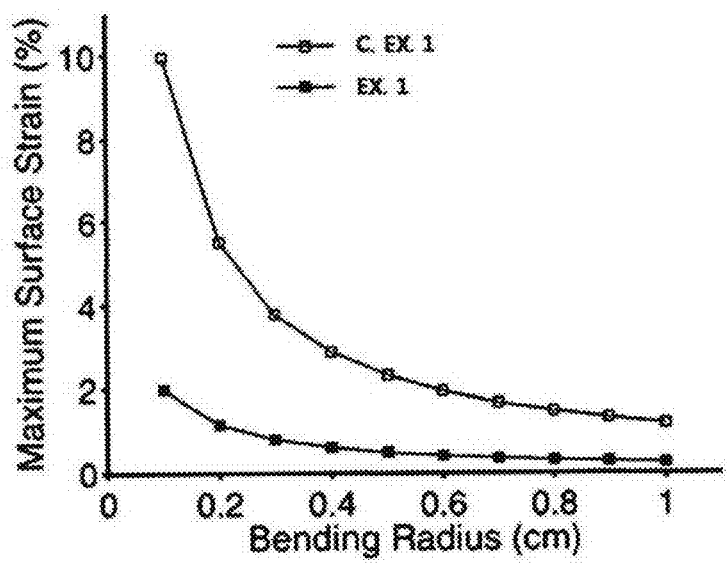
FIG. 8 shows the measured surface strain of the two samples of FIGS. 7A and 7B as a function of the bending radius.

From FIG. 8, it could be seen that when the bending radius was about 0.1 cm, the surface strain of the field-effect transistor substrate manufactured in Comparative Example 1 was about five times larger than that of the field-effect transistor substrate manufactured in Example 1.

Therefore, the silicon-based adhesive portion of the field-effect transistor manufactured in Example 1 absorbs shear stress to thus reduce the surface strain of the substrate such that it is even lower than that of the field-effect transistor manufactured in Comparative Example 1. That is, it is judged that the electronic device having the adhesive function of the present invention is applicable to various materials or apparatuses to thus minimize damage to the device attached to the surface of the substrate, owing to the low surface strain of the substrate, even if the substrate is bent.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A flexible electronic device having an adhesive function, comprising:
    an adhesive tape including a flexible film and an adhesive layer formed on one side of the flexible film; and
    an electronic device formed on a remaining side of the flexible film of the adhesive tape;
    wherein the adhesive tape further includes a surface reforming layer disposed on the remaining side of the flexible film to planarize a surface of the remaining side; and
    wherein the adhesive tape has a Young's modulus that is lower than a Young's modulus of the surface reforming layer.

2. The flexible electronic device of claim 1, wherein the electronic device includes the flexible film as a substrate.

3. The flexible electronic device of claim 1, wherein the surface reforming layer includes one or more selected from polyimide, polvacrylate, polyurethane, polyethylene, polyvinylphenol, and polyvinyl alcohol.

4. The flexible electronic device of claim 1, wherein the surface reforming layer has a root-mean-square roughness of 0.1 to 1 nm.

5. The flexible electronic device of claim 1, wherein the flexible electronic device is one or more selected from a field-effect transistor, a solar cell, an organic light emitting diode, a tactile sensor, a radio frequency identification tag, an electronic paper, and a bio sensor.

6. The flexible electronic device of claim 5, wherein the flexible electronic device is the field-effect transistor, and the field-effect transistor includes
    the adhesive tape including the flexible film and the adhesive layer formed on one side of the flexible film;
    a gate electrode positioned on a remaining side of the flexible film of the adhesive tape;
    a gate insulating layer positioned on the gate electrode;

a source electrode and a drain electrode positioned on the gate insulating layer and disposed so as to be spaced apart from each other; and an active layer positioned on the gate insulating layer to electrically connect the source electrode and the drain electrode.

7. The flexible electronic device of claim 6, wherein the gate insulating layer has a thickness of 1 to 10 nm.

8. The flexible electronic device of claim 6, wherein the active layer includes one or more selected from graphene, PQT-12 (poly(3,3'''-didodecyl quarterthiophene)), P3HT (poly(3-hexyl thiophene)), P3BT (poly(3-butyl thiophene)), P3OT (poly(3-octyl thiophene)), PPy (polypyrrole), PANI (polyaniline), PDPP (polydiketopyrrolopyrrole), PIID (polyisoindigo), PPDI (poly(perylene diimide)), PNDI (poly(naphthalene diimide)), PEO (poly(ethylene oxide)), PCL (poly(ϵ-caprolactone)), PMMA (poly(methyl methacrylate)), PS (polystyrene), PVP (poly(vinyl pyrrolidone)), pentacene, rubrene, copper phthalocyanine, and fullerene.

9. A method of manufacturing a flexible electronic device having an adhesive function, comprising:
(a) preparing an adhesive tape including a flexible film and an adhesive layer formed on one side of the flexible film;
(b) forming an electronic device on a remaining side of the flexible film of the adhesive tape; and
(c) applying a surface reforming layer on the remaining side of the flexible film of the adhesive tape after (a) the preparing the adhesive tape;
wherein the adhesive tape has a Young's modulus that is lower than a Young's modulus of the surface reforming layer.

10. The method of claim 9, wherein the electronic device of (b) the forming the electronic device is one or more selected from a field-effect transistor, a solar cell, an organic light emitting diode, a tactile sensor, a radio frequency identification tag, an electronic paper, and a bio sensor.

11. The method of claim 10, wherein the electronic device of (b) the forming the electronic device is the field-effect transistor, and (b) the forming the electronic device includes
(b-1) forming a gate electrode on a remaining side of a flexible film of an adhesive tape;
(b-2) forming a gate insulating layer on the gate electrode;
(b-3) forming a source electrode and a drain electrode on the gate insulating layer; and
(b-4) forming an active layer through which the source electrode and the drain electrode are electrically connected on the gate insulating layer.

12. The method of claim 11, wherein the active layer is a graphene layer, and the graphene layer is any one selected from graphene manufactured using physical or chemical stripping, graphene grown in SiC to be manufactured, and graphene manufactured using a chemical vapor deposition process.

13. The method of claim 11, wherein (b-4) the forming the active layer is performed using a dry transfer process.

14. The method of claim 11, wherein (b-2) the forming the gate insulating layer is performed using any one process selected from UV ozone treatment, heat treatment in an oxygen atmosphere, and oxygen plasma treatment.

15. The method of claim 14, wherein (b-2) the forming e gate insulating layer is performed using the oxygen plasma treatment.

16. The method of claim 15, wherein the oxygen plasma treatment is performed under a condition of RF power of 10 to 300 W.

17. The method of claim 15, wherein the oxygen plasma treatment is performed under a condition of pressure of 1 to 1000 mTorr.

* * * * *